(12) United States Patent  (10) Patent No.: US 8,749,266 B2
Lee  (45) Date of Patent: Jun. 10, 2014

(54) DATA OUTPUT CIRCUIT RESPONSIVE TO CALIBRATION CODE AND ON DIE TERMINATION CODE

(75) Inventor: Jiwang Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,232

(22) Filed: Sep. 3, 2012

(65) Prior Publication Data

US 2013/0194001 A1    Aug. 1, 2013

(30) Foreign Application Priority Data

Jan. 31, 2012  (KR) .................. 10-2012-0009984

(51) Int. Cl.
H03K 19/003   (2006.01)
G11C 7/10     (2006.01)
H04L 25/02    (2006.01)
H03K 19/00    (2006.01)

(52) U.S. Cl.
CPC ........ H04L 25/0278 (2013.01); H03K 19/0005 (2013.01); H04L 25/0298 (2013.01)
USPC ....................... 326/30; 365/189.05

(58) Field of Classification Search
USPC ........... 326/30; 365/229, 189.02, 189.05, 191
See application file for complete search history.

(56) References Cited

U.S. PATENT DOCUMENTS

| | | | | |
|---|---|---|---|---|
| 7,612,579 B2 * | 11/2009 | Fujisawa | ...................... | 326/30 |
| 7,893,710 B2 * | 2/2011 | Lee | ................ | 326/30 |
| 8,063,658 B2 * | 11/2011 | Gillingham | ................... | 326/30 |
| 2008/0304334 A1 * | 12/2008 | Lee et al. | ............... | 365/189.05 |
| 2010/0265780 A1 * | 10/2010 | Park et al. | .................... | 365/194 |
| 2011/0163778 A1 * | 7/2011 | Moon | ............ | 326/30 |
| 2012/0007631 A1 * | 1/2012 | Koo et al. | .................... | 326/30 |
| 2012/0256655 A1 * | 10/2012 | Kim | .............. | 326/30 |
| 2013/0015879 A1 * | 1/2013 | Araki | ............... | 326/30 |

\* cited by examiner

*Primary Examiner* — Alexander H Taningco
*Assistant Examiner* — Dylan White
(74) *Attorney, Agent, or Firm* — William Park & Associates Patent Ltd.

(57) ABSTRACT

A data output circuit includes a pre-code generation unit configured to generate one of a pre-pull-up code and a pre-pull-down code according to a calibration code in response to a voltage level of input data; and a plurality of main driving units configured to be selectively activated in response to an on-die termination code, wherein respective outputs of the plurality of main driving units are commonly connected to an output node, and wherein activated main driving units drive the output node in response to the pre-pull-up code or the pre-pull-down code.

18 Claims, 5 Drawing Sheets

DATA OUTPUT CIRCUIT RESPONSIVE TO CALIBRATION CODE AND ON DIE TERMINATION CODE

CROSS-REFERENCE TO RELATED APPLICATION

The present application claims priority under 35 U.S.C. §119(a) to Korean application number 10-2012-0009984, filed on Jan. 31, 2012, in the Korean Intellectual Property Office, which is incorporated herein by reference in its entirety.

BACKGROUND

1. Technical Field

The present invention generally relates to a semiconductor integrated circuit and to a data output circuit.

2. Related Art

Among semiconductor integrated circuits, a semiconductor memory apparatus refers to an apparatus which receives and stores data and outputs stored data. Thus, the semiconductor memory apparatus includes a data output circuit for outputting data.

Figure 1:
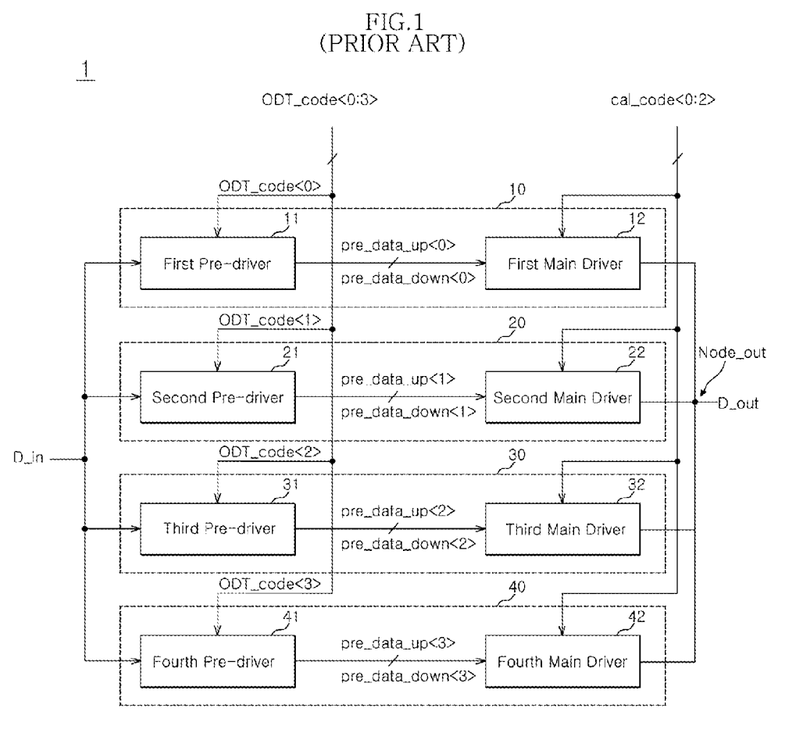
FIG. 1 is a configuration diagram of a conventional data output circuit of a semiconductor memory apparatus.

FIG. 1 shows a conventional data output circuit of a semiconductor memory apparatus.

A conventional data output circuit 1 is configured to drive internally stored data D_in in response to an on-die termination code ODT_code<0:3> (i.e., ODT_code<0>, ODT_code<1>, ODT_code<2>, ODT_code<3>) provided from an external controller and a calibration code cal_code<0:2> (i.e., cal_code<0>, cal_code<1>, cal_code<2>) provided from an internal calibration circuit and generate data D_out to be outputted to an outside. The on-die termination code ODT_code<0:3> and the calibration code cal_code<0:2> are codes to compensate for impedance mismatch between a semiconductor memory apparatus and an external circuit (controller). The calibration code cal_code<0:2> includes a P code Pcode<0:2> (not illustrated) and an N code Ncode<0:2> (not illustrated).

The data output circuit 1 includes first to fourth driving units 10, 20, 30 and 40.

The first driving unit 10 includes a first pre-driver 11 and a first main driver 12.

The first pre-driver 11 is configured to drive the input data D_in according to the first bit ODT_code<0> of the on-die termination code ODT_code<0:3> and generate first pre-pull-up data pre_data_up<0> and first pre-pull-down data pre_data_down<0>.

The first main driver 12 is configured to drive the first pre-pull-up data pre_data_up<0> and the first pre-pull-down data pre_data_down<0> according to the calibration code cal_code<0:2>, and transfer resultant data to an output node Node_out.

The second driving unit 20 includes a second pre-driver 21 and a second main driver 22.

The second pre-driver 21 is configured to drive the input data D_in according to the second bit ODT_code<1> of the on-die termination code ODT_code<0:3> and generate second pre-pull-up data pre_data_up<1> and second pre-pull-down data pre_data_down<1>.

The second main driver 22 is configured to drive the second pre-pull-up data pre_data_up<1> and the second pre-pull-down data pre_data_down<1> according to the calibration code cal_code<0:2>, and transfer resultant data to the output node Node_out.

The third driving unit 30 includes a third pre-driver 31 and a third main driver 32.

The third pre-driver 31 is configured to drive the input data D_in according to the third bit ODT_code<2> of the on-die termination code ODT_code<0:3> and generate third pre-pull-up data pre_data_up<2> and third pre-pull-down data pre_data_down<2>.

The third main driver 32 is configured to drive the third pre-pull-up data pre_data_up<2> and the third pre-pull-down data pre_data_down<2> according to the calibration code cal_code<0:2>, and transfer resultant data to the output node Node_out.

The fourth driving unit 40 includes a fourth pre-driver 41 and a fourth main driver 42.

The fourth pre-driver 41 is configured to drive the input data D_in according to the fourth bit ODT_code<3> of the on-die termination code ODT_code<0:3> and generate fourth pre-pull-up data pre_data_up<3> and fourth pre-pull-down data pre_data_down<3>.

The fourth main driver 42 is configured to drive the fourth pre-pull-up data pre_data_up<3> and the fourth pre-pull-down data pre_data_down<3> according to the calibration code cal_code<0:2>, and transfer resultant data to the output node Node_out. The voltage level of the output node Node_out is outputted as the output data D_out being the output of the data output circuit 1.

Figure 2:
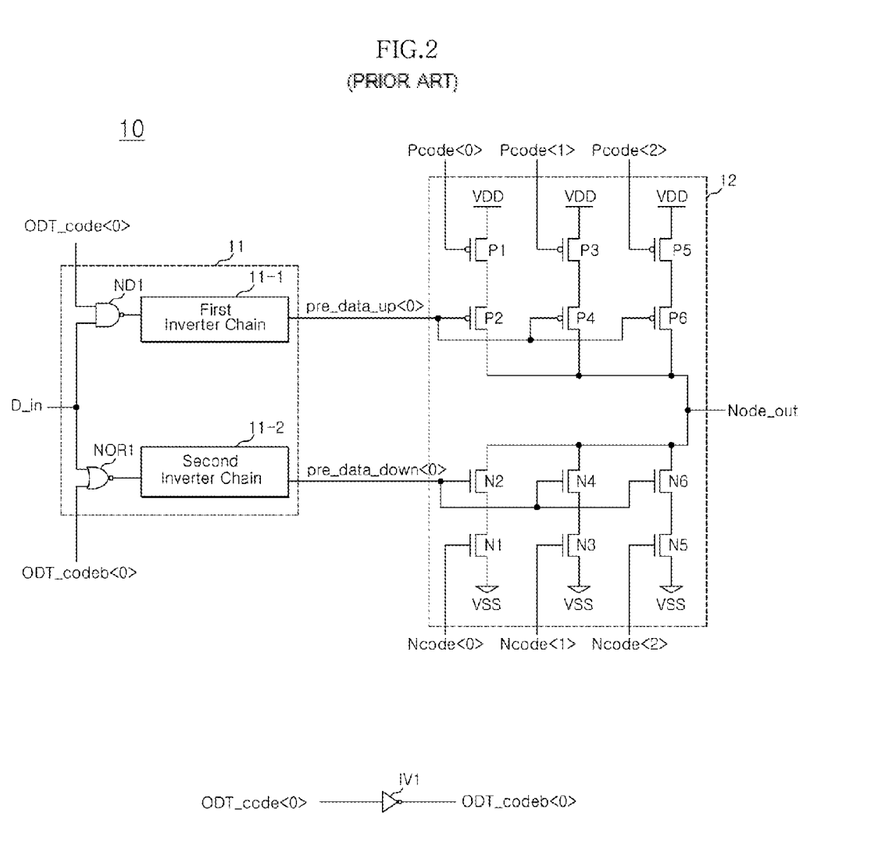
FIG. 2 is a configuration diagram of the first driving unit illustrated in FIG. 1.

FIG. 2 shows the first pre-driver 11 and the first main driver 12 of the first driving unit 10.

The first pre-driver 11 includes a NAND gate ND1, a NOR gate NOR1, and first and second inverter chains 11-1 and 11-2, respectively. The NAND gate ND1 is inputted with the first bit ODT_code<0> of the on-die termination code ODT_code<0:3> and the input data D_in. The NOR gate NOR1 is inputted with an inverted signal ODT_codeb<0> (i.e., through IV1) of the first bit ODT_code<0> of the on-die termination code ODT_code<0:3> and the input data D_in. The first inverter chain 11-1 is inputted with the output of the NAND gate ND1 and outputs the first pre-pull-up data pre_data_up<0>. The second inverter chain 11-2 is inputted with the output of the NOR gate NOR1 and outputs the first pre-pull-down data pre_data_down<0>.

The first main driver 12 includes first to twelfth transistors P1 to P6 and N1 to N6, respectively. The first transistor P1 has a gate which is inputted with the first bit Pcode<0> of the P code Pcode<0:2> and a source to which an external voltage VDD is applied. The second transistor P2 has a gate which is inputted with the first pre-pull-up data pre_data_up<0>, a source to which a drain of the first transistor P1 is connected and a drain to which the output node Node_out is connected. The third transistor P3 has a gate which is inputted with the second bit Pcode<1> of the P code Pcode<0:2> and a source to which the external voltage VDD is applied. The fourth transistor P4 has a gate which is inputted with the first pre-pull-up data pre_data_up<0>, a source to which a drain of the third transistor P3 is connected and a drain to which the output node Node_out is connected. The fifth transistor P5 has a gate which is inputted with the third bit Pcode<2> of the P code Pcode<0:2> and a source to which the external voltage VDD is applied. The sixth transistor P6 has a gate which is inputted with the first pre-pull-up data pre_data_up<0>, a source to which a drain of the fifth transistor P5 is connected and a drain to which the output node Node_out is connected. The seventh transistor N1 has a gate which is inputted with the first bit Ncode<0> of the N code Ncode<0:2> and a source to which a ground terminal VSS is connected. The eighth transistor N2 has a gate which is inputted with the first pre-pull-down data pre_data_down<0>, a drain to which the output node Node_ out is connected and a source to which a drain of the seventh transistor N1 is connected. The ninth transistor N3 has a gate which is inputted with the second bit Ncode<1> of the N code Ncode<0:2> and a source to which the ground terminal VSS is connected. The tenth transistor N4 has a gate which is inputted with the first pre-pull-down data pre_data_down<0>, a drain to which the output node Node_out is connected and a source to which a drain of the ninth transistor N3 is connected. The eleventh transistor N5 has a gate which is inputted with the third bit Ncode<2> of the N code Ncode<0:2> and a source to which the ground terminal VSS is connected. The twelfth transistor N6 has a gate which is inputted with the first pre-pull-down data pre_data_down<0>, a drain to which the output node Node_out is connected and a source to which a drain of the eleventh transistor N5 is connected.

The second to fourth driving units 20, 30 and 40 have the same configuration as the first driving unit 10 configured in this way except that their input signals are different.

In the first main driver 12 illustrated in FIG. 2, in order to drive the output node Node_out, the transistors which are inputted with the P code Pcode<i> and the first pre-pull-up data pre_data_up<0> are connected in series, and the transistors which are inputted with the N code Ncode<i> and the first pre-pull-down data pre_data_down<0> are connected in series. Thus, in order to drive the first to fourth main drivers 12, 22, 32 and 42 illustrated in FIG. 1, the first to fourth pre-drivers 11, 21, 31 and 41 should have large driving forces.

As a result, in the conventional data output circuit, since loading of the main drivers is substantial, current consumption increases and this is inappropriate for high speed operations.

SUMMARY

In an embodiment, a data output circuit includes: a pre-code generation unit configured to generate one of a pre-pull-up code and a pre-pull-down code according to a calibration code in response to a voltage level of input data; and a plurality of main driving units configured to be selectively activated in response to an on-die termination code, wherein respective outputs of the plurality of main driving units are commonly connected to an output node, and wherein activated main driving units drive the output node in response to the pre-pull-up code or the pre-pull-down code.

In another embodiment, a data output circuit includes: a pre-code generation unit configured to generate a pre-pull-up code and a pre-pull-down code in response to input data, an N code and a P code; and a plurality of main driving units configured to be selectively activated in response to an on-die termination code, wherein respective outputs of the plurality of main driving units drive an output node, and wherein the pre-pull-up code and the pre-pull-down code determine a driving force of activated main driving units.

BRIEF DESCRIPTION OF THE DRAWINGS

Features, aspects, and embodiments are described in conjunction with the attached drawings, in which.

DETAILED DESCRIPTION

Hereinafter, a data output circuit will be described below with reference to the accompanying drawings through various embodiments.

Figure 3:
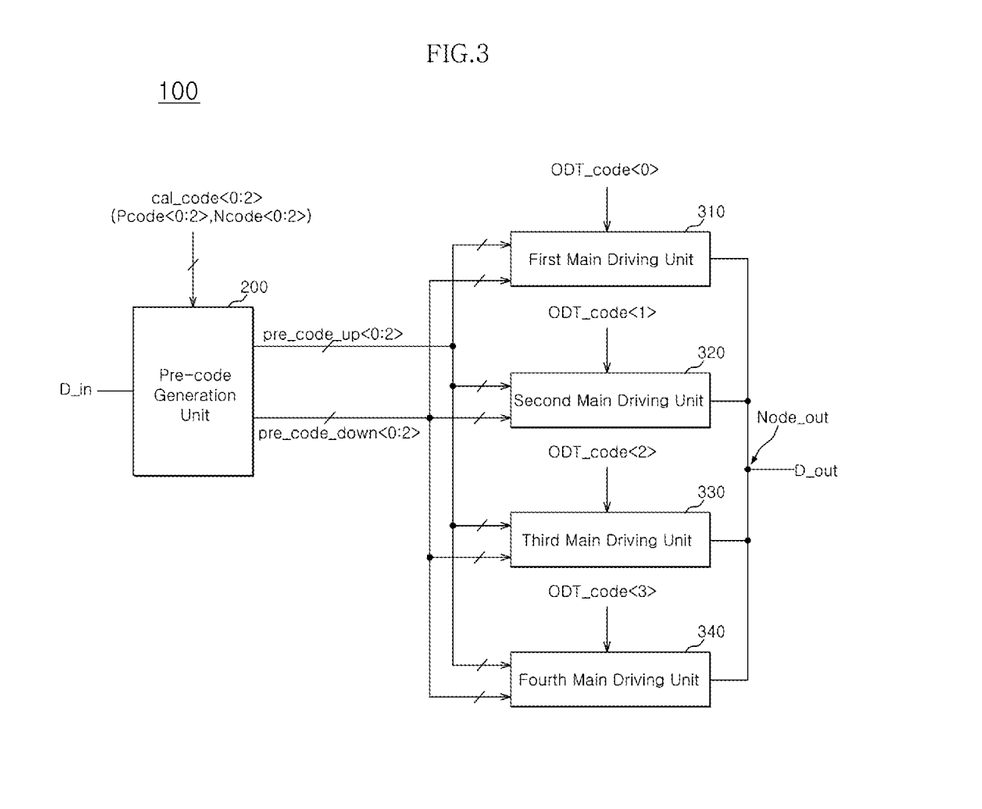
FIG. 3 is a configuration diagram of a data output circuit of a semiconductor memory apparatus in accordance with an embodiment.

Referring to FIG. 3, a data output circuit 100 of a semiconductor memory apparatus in accordance with an embodiment may include a pre-code generation unit 200, and first to fourth main driving units 310, 320, 330, and 340.

The pre-code generation unit 200 may be configured to generate one of a pre-pull-up code pre_code_up<0:2> (i.e., pre_code_up<0>, pre_code_up<1>, pre_code_up<2>) and a pre-pull-down code pre_code_down<0:2> (i.e., pre_code_down<0>, pre_code_down<1>, pre_code_down<2>) according to a calibration code cal_code<0:2> (i.e., cal_code<0>, cal_code<1>, cal_code<2>) in response to the voltage level of the input data D_in. For example, the pre-code generation unit 200 may generate the pre-pull-up code pre_code_up<0:2> according to the calibration code cal_code<0:2> when the voltage level of the input data D_in is at a high voltage level, and may generate the pre-pull-down code pre_code_down<0:2> according to the calibration code cal_code<0:2> when the voltage level of the input data D_in is at a low voltage level. The calibration code cal_code<0:2> may include a P code Pcode<0:2> (i.e., Pcode<0>, Pcode<1>, Pcode<2>) and an N code Ncode<0:2> (i.e., Ncode<0>, Ncode<1>, Ncode<2>). In detail, the pre-code generation unit 200 may generate the pre-pull-up code pre_code_up<0:2> according to the P code Pcode<0:2> when the voltage level of the input data D_in is a high voltage level, and may generate the pre-pull-down code pre_code_down<0:2> according to the N code Ncode<0:2> when the voltage level of the input data D_in is a low voltage level.

The first to fourth main driving units 310, 320, 330, and 340 may be configured to be selectively activated in response to an on-die termination code ODT_code<0:3> (i.e., ODT_code<0>, ODT_code<1>, ODT_code<2>, ODT_code<3>). The respective outputs of the first to fourth main driving units 310, 320, 330, and 340 may be commonly connected to an output node Node_out and may determine a driving force for driving the output node Node_out in response to the calibration code cal_code<0:2>. The calibration code cal_code<0:2> and the on-die termination code ODT_code<0:3> may be codes to compensate for impedance mismatch between a semiconductor memory apparatus and an external circuit (controller). The calibration code cal_code<0:2> may be a code which may be generated in the semiconductor memory apparatus, and the on-die termination code ODT_code<0:3> may be a code which may be provided from the external circuit (controller).

Figure 4:
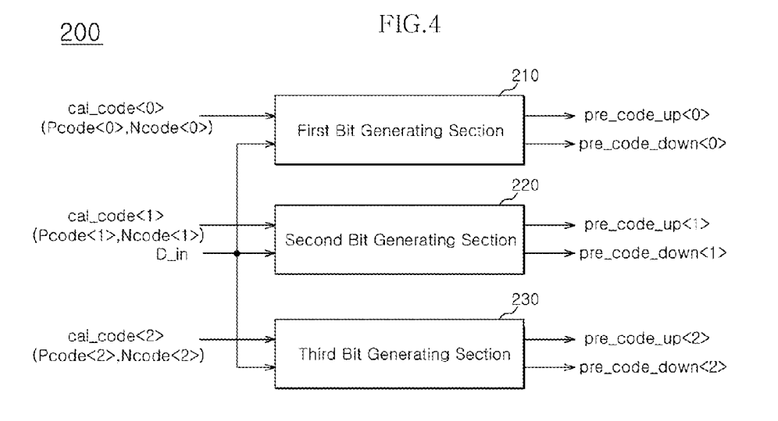
FIG. 4 is a configuration diagram of the pre-code generation unit illustrated in FIG. 3.

Referring to FIG. 4, the pre-code generation unit 200 may include first to third bit generating sections 210, 220, and 230, respectively. The calibration code cal_code<0:2> may include first to third calibration code bits cal_code<0>, cal_code<1>, and cal_code<2>, respectively. The pre-pull-up code pre_code_up<0:2> may include first to third pre-pull-up code bits pre_code_up<0>, pre_code_up<1>, and pre_code_up<2>, respectively. The pre-pull-down code pre_code_down<0:2> may include first to third pre-pull-down code bits pre_code_down<0>, pre_code_down<1>, and pre_code_down<2>, respectively. The P code Pcode<0:2> included in the calibration code cal_code<0:2> may include first to third P code bits Pcode<0>, Pcode<1>, and Pcode<2>, respectively. The N code Ncode<0:2> included in the calibration code cal_code<0:2> may include first to third N code bits Ncode<0>, Ncode<1>, and Ncode<2>, respectively.

The first bit generating section 210 may be configured to drive the first calibration code bit cal_code<0> according to the voltage level of the input data D_in and generate one of the first pre-pull-up code bit pre_code_up<0> and the first pre-pull-down code bit pre_code_down<0>. For example, the first bit generating section 210 may drive the first P code bit Pcode<0> and may generate the first pre-pull-up code bit pre_code_up<0> when the voltage level of the input data D_in is at a high voltage level, and may drive the first N code bit Ncode<0> and may generate the first pre-pull-down code bit pre_code_down<0> when the voltage level of the input data D_in is at a low voltage level.

The second bit generating section 220 may be configured to drive the second calibration code bit cal_code<1> according to the voltage level of the input data D_in and generate one of the second pre-pull-up code bit pre_code_up<1> and the second pre-pull-down code bit pre_code_down<1>. For example, the second bit generating section 220 may drive the second P code bit Pcode<1> and may generate the second pre-pull-up code bit pre_code_up<1> when the voltage level of the input data D_in is at a high voltage level, and may drive the second N code bit Ncode<1> and may generate the second pre-pull-down code bit pre_code_down<1> when the voltage level of the input data D_in is at a low voltage level.

The third bit generating section 230 may be configured to drive the third calibration code bit cal_code<2> according to the voltage level of the input data D_in and generate one of the third pre-pull-up code bit pre_code_up<2> and the third pre-pull-down code bit pre_code_down<2>. For example, the third bit generating section 230 may drive the third P code bit Pcode<2> and may generate the third pre-pull-up code bit pre_code_up<2> when the voltage level of the input data D_in is at a high voltage level, and may drive the third N code bit Ncode<2> and may generate the third pre-pull-down code bit pre_code_down<2> when the voltage level of the input data D_in is at a low voltage level.

Figure 5:
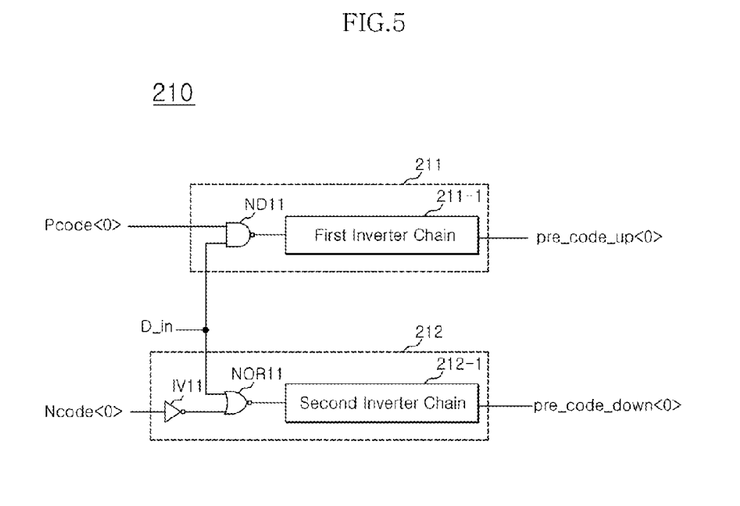
FIG. 5 is a configuration diagram of the first bit generating section illustrated in FIG. 4.

Referring to FIG. 5, the first bit generating section 210 may include a pre-pull-up code generating part 211 and a pre-pull-down code generating part 212.

The pre-pull-up code generating part 211 may drive the first P code bit Pcode<0> and may generate the first pre-pull-up code bit pre_code_up<0> when the voltage level of the input data D_in is at a high voltage level. The pre-pull-up code generating part 211 may lock the first pre-pull-up code bit pre_code_up<0> to a first specified voltage level (for example, a high voltage level) regardless of the first P code bit Pcode<0> when the voltage level of the input data D_in is at a low voltage level.

The pre-pull-up code generating part 211 may include a NAND gate ND11 and a first inverter chain 211-1. The NAND gate ND11 may be inputted with the first P code bit Pcode<0> and the input data D_in. The first inverter chain 211-1 may be inputted with the output signal of the NAND gate ND11 and may output the first pre-pull-up code bit pre_code_up<0>.

The pre-pull-down code generating part 212 may drive the first N code bit Ncode<0> and may generate the first pre-pull-down code bit pre_code_down<0> when the voltage level of the input data D_in is at a low voltage level. The pre-pull-down code generating part 212 may lock the first pre-pull-down code bit pre_code_down<0> to a second specified voltage level (for example, a low voltage level) regardless of the first N code bit Ncode<0> when the voltage level of the input data D_in is at a high voltage level.

The pre-pull-down code generating part 212 may include a NOR gate NOR11, a first inverter IV11, and a second inverter chain 212-1. The first inverter IV11 may be inputted with the first N code bit Ncode<0>. The NOR gate NOR11 may be inputted with the input data D_in and the output signal of the first inverter IV11. The second inverter chain 212-1 may be inputted with the output signal of the NOR gate NOR11 and may output the first pre-pull-down code bit pre_code_down<0>.

The second and third bit generating sections 220 and 230, respectively, have substantially the same configuration as the first bit generating section 210 except that their input signals and output signals are different in regards to the names. Therefore, since the pre-pull-up code generating part 211 and the pre-pull-down code generating part 212 included in the first bit generating section 210 are also included in the second and third bit generating sections 220 and 230, the pre-code generation unit 200 in accordance with an embodiment may include a total of three pre-pull-up code generating parts and a total of three pre-pull-down code generating parts. Other embodiments may include different numbers of pre-pull-up code generating parts and pre-pull-down code generating parts.

Each of the first to fourth main driving units 310, 320, 330, and 340 illustrated in FIG. 3 may be inputted with one bit ODT_code<i> corresponding to the on-die termination code ODT_code<0:3> and may be activated in response to the inputted bit ODT_code<i>. For example, the first main driving unit 310 may be activated in response to the first on-die termination code bit ODT_code<0>. The second main driving unit 320 may be activated in response to the second on-die termination code bit ODT_code<1>. The third main driving unit 330 may be activated in response to the third on-die termination code bit ODT_code<2>. The fourth main driving unit 340 may be activated in response to the fourth on-die termination code bit ODT_code<3>.

Since the first to fourth main driving units 310, 320, 330, and 340 may be configured substantially in the same way, only the configuration of the first main driving unit 310 will be described below.

Figure 6:
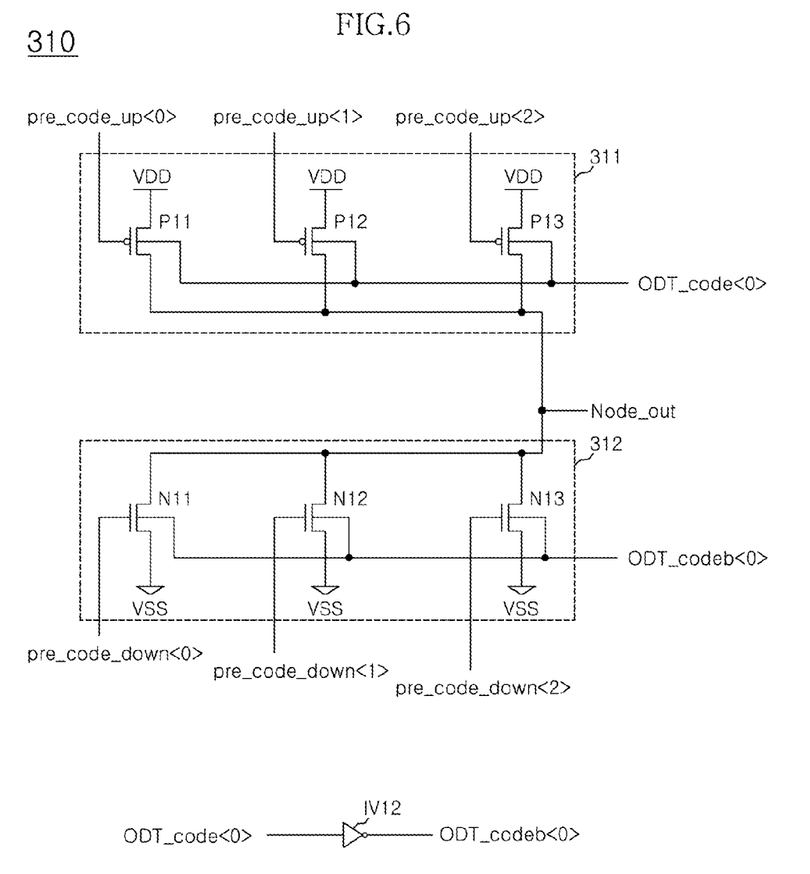
FIG. 6 is a configuration diagram of the first main driving unit illustrated in FIG. 3.

Referring to FIG. 6, the first main driving unit 310 may include a pull-up driving section 311 and a pull-down driving section 312.

The pull-up driving section 311 may be activated in response to the first on-die termination code bit ODT_code<0>, and when activated, may determine a pull-up driving force for driving the output node Node_out in response to the first pre-pull-up code pre_code_up<0:2>.

The pull-up driving section 311 may include first to third transistors P11, P12, and P13, respectively. The first transistor P11 has a gate which may be inputted with the first pre-pull-up code bit pre_code_up<0>, a source which may be applied with an operating voltage VDD, a drain to which the output node Node_out may be connected, and a back bias terminal to which the first on-die termination code bit ODT_code<0> may be inputted. The second transistor P12 may have a gate which may be inputted with the second pre-pull-up code bit pre_code_up<1>, a source which may be applied with the operating voltage VDD, a drain to which the output node Node_out may be connected, and a back bias terminal to which the first on-die termination code bit ODT_code<0> may be inputted. The third transistor P13 has a gate which may be inputted with the third pre-pull-up code bit pre_code_up<2>, a source which may be applied with the operating voltage VDD, a drain to which the output node Node_out may be connected, and a back bias terminal to which the first on-die termination code bit ODT_code<0> may be inputted.

The pull-down driving section 312 may be activated in response to the first on-die termination code bit ODT_code<0>, and when activated, determines a pull-down driving force for driving the output node Node_out in response to the first pre-pull-down code pre_code_down<0:2>.

The pull-down driving section 312 may include fourth to sixth transistors N11, N12, and N13. The fourth transistor N11 has a gate which may be inputted with the first pre-pull-down code bit pre_code_down<0>, a source to which a ground terminal VSS is connected, a drain to which the output node Node_out may be connected, and a back bias terminal to which an inverted signal ODT_codeb<0> of the first on-die termination code bit ODT_code<0> may be inputted. The fifth transistor N12 may have a gate which may be inputted with the second pre-pull-down code bit pre_code_down<1>, a source to which the ground terminal VSS may be connected, a drain to which the output node Node_out may be connected, and a back bias terminal to which the inverted signal ODT_codeb<0> of the first on-die termination code bit ODT_code<0> may be inputted. The sixth transistor N13 may have a gate which may be inputted with the third pre-pull-down code bit pre_code_down<2>, a source to which the ground terminal VSS may be connected, a drain to which the output node Node_out may be connected and a back bias terminal to which the inverted signal ODT_codeb<0> of the first on-die termination code bit ODT_code<0> may be inputted. A second inverter IV12 may invert the first on-die termination code bit ODT_code<0> and may generate the inverted signal ODT_codeb<0> of the first on-die termination code bit ODT_code<0>.

The data output circuit of a semiconductor memory apparatus in accordance with an embodiment, configured as mentioned above, may operate as described below.

When the input data D_in has a high voltage level, the pre-code generation unit 200 may generate the pre-pull-up code pre_code_up<0:2> in response to the calibration code cal_code<0:2>. Thus, when the input data D_in has a high voltage level, the pre-code generation unit 200 may drive the P code Pcode<0:2> and may generate the pre-pull-up code pre_code_up<0:2>.

When the input data D_in has a low voltage level, the pre-code generation unit 200 may generate the pre-pull-down code pre_code_down<0:2> in response to the calibration code cal_code<0:2>. Thus, when the input data D_in has a low voltage level, the pre-code generation unit 200 may drive the N code Ncode<0:2> and may generate the pre-pull-down code pre_code_down<0:2>.

The first to fourth main driving units 310, 320, 330, and 340 may be selectively activated in response to the on-die termination code ODT_code<0:3>. For example, when assuming that the first and second main driving units 310 and 320 among the first to fourth main driving units 310, 320, 330, and 340 are activated according to the on-die termination code ODT_code<0:3>, the first and second main driving units 310 and 320 may drive the output node Node_out in response to the pre-pull-up code pre_code_up<0:2> and the pre-pull-down code pre_code_down<0:2>. The voltage level of the output node Node_out may be outputted as the voltage level of output data D_out.

As is apparent from the above descriptions, in the data output circuit of a semiconductor memory apparatus in accordance with an embodiment, a calibration code, that is, one code of a P code and an N code may be driven according to a voltage level of input data, and a pre-pull-up code or a pre-pull-down code may be generated. Also, a plurality of main driving units may be selectively activated in response to an on-die termination code, and activated main driving units may drive an output node according to the pre-pull-up code or the pre-pull-down code. Additionally, in an embodiment, by inputting a one bit of the on-die termination code to the back bias terminals of transistors constituting each main driving unit, that is, transistors connected to an output node, whether to activate each main driving unit may be determined.

As a consequence, in the data output circuit in accordance with an embodiment, since the number of transistors constituting a main driving unit decreases and loading is lessened when compared to the conventional data output circuit as illustrated in FIGS. 1 and 2, current consumption is reduced and advantages are provided in terms of high speed operation. Moreover, as illustrated in FIG. 2, in the conventional data output circuit, loading is augmented due to two transistors connected in series to drive the output node Node_out by one P code Pcode<i> or one N code Ncode<k>. However, in the main driver according to an embodiment, since transistors for driving the output node Node_out are not connected in series as illustrated in FIG. 2, loading is lessened.

While certain embodiments have been described above, it will be understood to those skilled in the art that the embodiments described are by way of example only. Accordingly, the data output circuit described herein should not be limited based on the described embodiments.

What is claimed is:

1. A data output circuit comprising:
   a pre-code generation unit configured to generate one of a pre-pull-up code and a pre-pull-down code according to a calibration code in response to a voltage level of input data; and
   a plurality of main driving units configured to be selectively activated in response to an on-die termination code, wherein each main driving unit includes a plurality of first transistors and a plurality of second transistors having back bias terminals receiving the on-die termination code,
   wherein respective outputs of the plurality of main driving units are commonly connected to an output node, and
   wherein activated main driving units drive the output node in response to the pre-pull-up code or the pre-pull-down code.

2. The data output circuit according to claim 1,
   wherein the calibration code and the on-die termination code are codes to compensate for impedance mismatch between a semiconductor memory apparatus and an external circuit,
   wherein the calibration code is a code which is generated by the semiconductor memory apparatus, and
   wherein the on-die termination code is a code which is provided from the external circuit.

3. The data output circuit according to claim 1, wherein the pre-code generation unit generates the pre-pull-up code in response to the calibration code when a voltage level of the input data is at a high voltage level and the pre-code generation unit generates the pre-pull-down code in response to the calibration code when a voltage level of the input data is at a low voltage level.

4. The data output circuit according to claim 3, wherein the pre-code generation unit comprises:
   a plurality of pre-pull-up code generating parts configured to drive respective bits of the calibration code and generate respective bits of the pre-pull-up code when the voltage level of the input data is at a high voltage level; and a plurality of pre-pull-down code generating parts configured to drive respective bits of the calibration code and generate respective bits of the pre-pull-down code when the voltage level of the input data is at a low voltage level.

5. The data output circuit according to claim 4,
wherein the pre-pull-up code generating parts lock the respective bits of the pre-pull-up code to a first specified voltage level when the voltage level of the input data is at a low voltage level, and
wherein the pre-pull-down code generating parts lock the respective bits of the pre-pull-down code to a second specified voltage level when the voltage level of the input data is at high voltage level.

6. The data output circuit according to claim 1, wherein each of the plurality of main driving units is inputted with one bit corresponding to the on-die termination code and is activated in response to the inputted bit.

7. The data output circuit according to claim 6, wherein each of the plurality of main driving units comprises:
a pull-up driving section configured to perform a pull-up operation for the output node in response to the pre-pull-up code; and
a pull-down driving section configured to perform a pull-down operation for the output node in response to the pre-pull-down code.

8. The data output circuit according to claim 7,
wherein the pull-up driving section comprises the plurality of first transistors having gates which are respectively inputted with respective bits of the pre-pull-up code, sources which are applied with an operating voltage, and drains to which the output node is connected, and
wherein the pull-down driving section comprises the plurality of second transistors having gates which are respectively inputted with respective bits of the pre-pull-down code, drains to which the output node is connected, and sources to which a ground terminal is connected.

9. The data output circuit according to claim 8,
wherein the plurality of first transistors have back bias terminals which are inputted with one bit corresponding to the on-die termination code, and
wherein the plurality of second transistors have back bias terminals which are inputted with an inverted voltage level of the one bit inputted to the plurality of first transistors,
whereby whether to activate the pull-up driving section and the pull-down driving section of each main driving unit is determined.

10. A data output circuit comprising:
a pre-code generation unit configured to generate a pre-pull-up code and a pre-pull-down code in response to input data, an N code, and a P code; and
a plurality of main driving units configured to be selectively activated in response to an on-die termination code, wherein each main driving unit includes transistors having back bias terminals receiving the on-die termination code,
wherein respective outputs of the plurality of main driving units drive an output node, and
wherein the pre-pull-up code and the pre-pull-down code determine a driving force of activated main driving units.

11. The data output circuit according to claim 10, wherein the pre-code generation unit generates the pre-pull-up code according to the P code or pre-pull-down code according to the N code in response to a voltage level of the input data.

12. The data output circuit according to claim 11,
wherein the N code includes first and second N code bits, the P code includes first and second P code bits, the pre-pull-up code includes first and second pre-pull-up code bits, and the pre-pull-down code includes first and second pre-pull-down code bits.

13. The data output circuit according to claim 12, wherein the pre-code generation unit comprises:
a first bit generating section configured to generate the first pre-pull-up code bit and the first pre-pull-down code bit in response to the input data, the first P code bit, and the first N code bit, and
a second bit generating section configured to generate the second pre-pull-up code bit and the second pre-pull-down code bit in response to the input data, the second P code bit, and the second N code bit.

14. The data output circuit according to claim 13,
wherein the first bit generating section generates the first pre-pull-up code bit in response to the first P code bit when the voltage level of the input data is at a high voltage level, and generates the first pre-pull-down code bit in response to the first N code bit when the voltage level of the input data is at a low voltage level, and
wherein the second bit generating section generates the second pre-pull-up code bit in response to the second P code bit when the voltage level of the input data is at a high voltage level, and generates the second pre-pull-down code bit in response to the second N code bit when the voltage level of the input data is at a low voltage level.

15. The data output circuit according to claim 14,
wherein the plurality of main driving units include first and second main driving units,
wherein the on-die termination code includes first and second on-die termination code bits.

16. The data output circuit according to claim 15,
wherein the first main driving unit is activated in response to the first on-die termination code bit, and when activated, drives the output node in response to the first and second pre-pull-up code bits and the first and second pre-pull-down code bits, and
wherein the second main driving unit is activated in response to the second on-die termination code bit, and when activated, drives the output node in response to the first and second pre-pull-up code bits and the first and second pre-pull-down code bits.

17. The data output circuit according to claim 16, wherein the first main driving unit comprises:
a first transistor having a gate which is inputted with the first pre-pull-up code bit, a source which is applied with an operating voltage, a drain to which the output node is connected and a back bias terminal to which the first on-die termination code bit is inputted;
a second transistor having a gate which is inputted with the second pre-pull-up code bit, a source which is applied with the operating voltage, a drain to which the output node is connected and a back bias terminal to which the first on-die termination code bit is inputted;
a third transistor having a gate which is inputted with the first pre-pull-down code bit, a drain to which the output node is connected, a source to which a ground terminal is connected and a back bias terminal to which an inverted signal of the first on-die termination code bit is inputted; and
a fourth transistor having a gate which is inputted with the second pre-pull-down code bit, a drain to which the output node is connected, a source to which the ground terminal is connected and a back bias terminal to which the inverted signal of the first on-die termination code bit is inputted.

18. The data output circuit according to claim 16, wherein the second main driving unit comprises:
- a first transistor having a gate which is inputted with the first pre-pull-up code bit, a source which is applied with the operating voltage, a drain to which the output node is connected and a back bias terminal to which the second on-die termination code bit is inputted;
- a second transistor having a gate which is inputted with the second pre-pull-up code bit, a source which is applied with the operating voltage, a drain to which the output node is connected and a back bias terminal to which the second on-die termination code bit is inputted;
- a third transistor having a gate which is inputted with the first pre-pull-down code bit, a drain to which the output node is connected, a source to which the ground terminal is connected and a back bias terminal to which an inverted signal of the second on-die termination code bit is inputted; and
- a fourth transistor having a gate which is inputted with the second pre-pull-down code bit, a drain to which the output node is connected, a source to which the ground terminal is connected and a back bias terminal to which the inverted signal of the second on-die termination code bit is inputted.

\* \* \* \* \*